United States Patent [19]

Ikeda

[11] Patent Number: 5,812,021
[45] Date of Patent: Sep. 22, 1998

[54] SEMICONDUCTOR INTEGRATED CIRCUIT DEVICE HAVING AN INTERNAL POWER SUPPLY CIRCUIT CAPABLE OF STABLY MAINTAINING OUTPUT LEVEL AGAINST LOAD FLUCTUATION

[75] Inventor: Yutaka Ikeda, Hyogo, Japan

[73] Assignee: Mitsubishi Denki Kabushiki Kaisha, Tokyo, Japan

[21] Appl. No.: 962,074

[22] Filed: Oct. 31, 1997

Related U.S. Application Data

[63] Continuation of Ser. No. 910,266, Aug. 13, 1997, abandoned, which is a continuation of Ser. No. 675,764, Jul. 3, 1996, abandoned.

[30] Foreign Application Priority Data

Jan. 26, 1996 [JP] Japan ..................................... 8-012146

[51] Int. Cl.$^6$ .......................................................... G05F 1/10
[52] U.S. Cl. ........................ 327/541; 327/313; 327/321; 327/323; 327/540; 323/315
[58] Field of Search ...................... 317/540, 541, 317/543, 545, 546, 312, 313, 321, 323, 327; 323/315, 316

[56] References Cited

U.S. PATENT DOCUMENTS

| | | | |
|---|---|---|---|
| 3,349,336 | 10/1967 | Luna | 327/327 |
| 3,536,958 | 10/1970 | Sondermeyer | 327/545 |
| 4,649,291 | 3/1987 | Konishi . | |
| 4,950,976 | 8/1990 | Wagoner | 323/312 |
| 5,264,743 | 11/1993 | Nakagome et al. | 327/546 |
| 5,528,190 | 6/1996 | Honnigford | 327/323 |
| 5,534,817 | 7/1996 | Suzuki et al. | 327/546 |

FOREIGN PATENT DOCUMENTS

| | | |
|---|---|---|
| A-0 157 905 | 10/1985 | European Pat. Off. . |
| A-0 195 525 | 9/1986 | European Pat. Off. . |
| A-0 248 381 | 12/1987 | European Pat. Off. . |
| A-42 34 667 | 9/1993 | Germany . |
| 63-6908 | 1/1988 | Japan . |

*Primary Examiner*—Terry Cunningham
*Attorney, Agent, or Firm*—McDermott, Will & Emery

[57] ABSTRACT

An object is to provide a semiconductor device having an internal power supply circuit capable of supplying stable internal power supply voltage while not increasing layout area. A differential amplifying circuit in a voltage down converter controls potential level $V_{OUT}$ of the drain of transistor P14 such that it attains the reference potential $V_{REF}$. If the potential $V_{OUT}$ increases, the gate potential of transistor N12 increases because of coupling function of a capacitance C2, and the transistor is rendered conductive. Thus the potential level $V_{OUT}$ is pulled down. By contrast, if the potential level $V_{OUT}$ lowers, transistor P12 is rendered conductive, and the potential level $V_{OUT}$ is pulled up.

6 Claims, 6 Drawing Sheets

SEMICONDUCTOR INTEGRATED CIRCUIT DEVICE HAVING AN INTERNAL POWER SUPPLY CIRCUIT CAPABLE OF STABLY MAINTAINING OUTPUT LEVEL AGAINST LOAD FLUCTUATION

This application is a continuation of application Ser. No. 08/910,266 now abandoned, filed Aug. 13, 1997, which is a continuation of application Ser. No. 08/675,764 filed Jul. 3, 1996 now abandoned.

BACKGROUND OF THE INVENTION

1. Field of the Invention

The present invention relates to a semiconductor integrated circuit device and, more specifically, to a semiconductor integrated circuit device having an internal power supply circuit such as a dynamic random access memory (hereinafter referred to as a DRAM).

2. Description of the Background Art

As the degree of integration of semiconductor memory devices such as DRAMs has been increased and the gate length of an MOS transistor has been scaled down, it becomes indispensable to lower the operational power supply voltage in order to reduce power consumption while ensuring reliability of the transistor. However, in order to maintain compatibility with transistor-transistor logic (herein after referred to as TTL), conventional 5 V has been used as an external voltage level for the semiconductor memory device.

Therefore, generally a method has been adopted to satisfy the requirements of high reliability, high speed operation and low power consumption in which an internal down converter is used for down converting the external power supply voltage ext.Vcc from 5 V to about 3 to 4 V and supplying it to internal circuitry in the chip.

Though the memory cell area has been reduced exponentially because of higher integration of the DRAM, a memory cell capacitor must have at least a prescribed capacitance in order to ensure sufficient S/N ratio and soft error immunity. Accordingly, the thickness of the insulating film in the memory cell capacitor is made thinner unavoidably. However, when the film is to be made thinner, difficulties such as degradation of film quality and increase in tunnelling in current are experienced. Generally, in order to cope with such difficulties, memory cell plate potential Vcp is set to Vcc/2 in order to decrease charge intensity in the insulating film.

As the degree of integration has been higher, the space between the bit lines becomes so narrow that interfering noises applied from adjacent bit line through coupling capacitances between the bit lines becomes innegligible. In order to solve this problem, the noises are canceled by arranging a pair of bit lines adjacent to each other and commonly superposing the noises applied to the bit line to the pair of bit lines. In this case, the bit lines are set to Vcc/2 (precharge voltage: $V_{BL}$) where Vcc is the power supply voltage, at the time of standby.

As described above, in the semiconductor integrated circuit devices such as DRAMs which has been integrated to higher degree, though one single external power supply of 5 V is used, internal power supply circuits for providing various potentials necessary for circuit operation in the chip are mounted.

Output potentials from these internal power supply circuits have direct influence to speed of operation, operation margin and so on of the internal circuitry in the semiconductor integrated circuit device, and hence it is necessary that the output potentials are stable.

Figure 7:
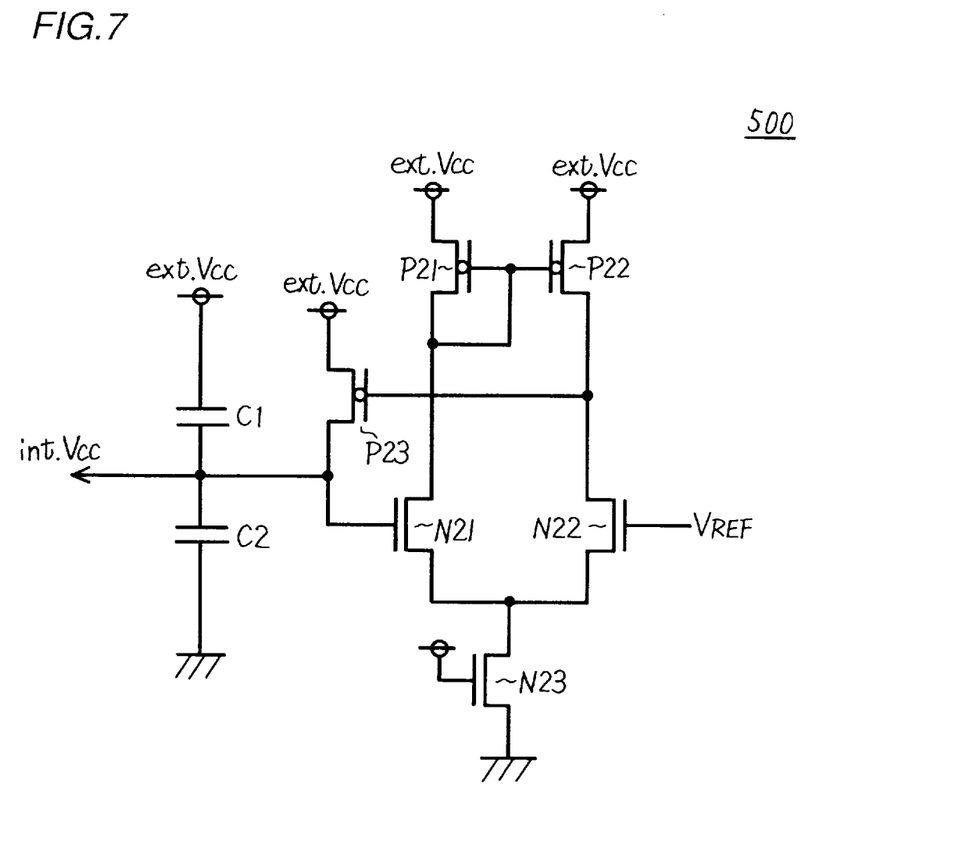
FIG. 7 is a circuit diagram of a main portion showing a structure of a conventional internal voltage down convertor.

FIG. 7 is a schematic diagram showing, with some portions omitted, the structure of a conventional internal down converter 500.

Internal down converter 500 includes a current mirror circuit consisting of a pair of P channel MOS transistors P21 and P22 receiving the power supply potential ext.Vcc at their sources; an N channel MOS transistor N22 having its drain connected to the drain of P channel MOS transistor P22 and receiving at its gate a reference potential $V_{REF}$; an N channel MOS transistor N21 having its drain connected to the drain of P channel MOS transistor P21; and an N channel MOS transistor N23 connected between the sources of N channel MOS transistors N21 and N22 and the ground potential Vss and receiving at its gate the power supply potential Vcc.

MOS transistors P21, P22, N21, N22 and N23 constitute a current mirror type differential amplifying circuit. In this case, gates of N channel MOS transistors N21 and N22 serve as first and second input nodes of the differential amplifying circuit, and a node between the drain of P channel MOS transistor P22 and the drain of N channel MOS transistor N22 serves as an output node of the differential amplifying circuit.

Though the gate potential of N channel MOS transistor N23 is fixed at the power supply potential Vcc in the above described structure, the gate may receive as an input a differential amplifying circuit activating signal, so that operation of the differential amplifying circuit is controlled by the differential amplifying circuit activating signal.

Internal down converter 500 further includes a P channel MOS transistor P23 receiving at its gate the potential at the output node of the differential amplifying circuit, at its source the power supply potential ext.Vcc and having its drain connected to the gate of N channel MOS transistor N21. The potential at the drain of P channel MOS transistor P23 is output as internally down converted potential int.Vcc.

More specifically, when the internally down converted potential becomes smaller than the reference potential $V_{REF}$, there is generated a potential difference between the inputs to the differential amplifying circuit, and the potential at the output node changes to the negative side than the potential in the steady state. More specifically, the gate potential of P channel MOS transistor P23 becomes lower and the transistor is more strongly turned on, so that the potential level at the output node rises.

By contrast, when the potential at the output node, that is, the gate potential of N channel MOS transistor N21 becomes higher than the reference potential $V_{REF}$, the output potential level of the differential amplifying circuit also increases correspondingly. Therefore, gate potential of P channel MOS transistor P23 also increases. Therefore, P channel MOS transistor P23 is rendered more weakly on, so that the potential level at the output node, that is, at the drain of P channel MOS transistor P23, becomes lower.

By the above described operation, the potential level int.Vcc at the output node is controlled such that it coincides with the reference potential $V_{REF}$.

In this case, in order to attain higher stability of the potential level at the output node, generally, a capacitor C1 is connected between the output node and the node to which power supply potential ext.Vcc is supplied, and a capacitor C is connected between the output node and the node to which the ground potential Vss is supplied.

Since there are capacitances C1 and C2, change in the potential level at the output node requires charging/discharging of the capacitors, which means that fluctuation in the potential level at the output node is suppressed.

However, in the conventional internal down converter 500 such as described above, it is necessary to increase capacitances of capacitors of C1 and C2 in order to attain higher stability of the output potential level.

Since there is a lower limit of the thickness of the dielectric film constituting the capacitor in view of reliance, for example, it is necessary to increase area of the capacitor in order to have a prescribed capacitance or more of capacitances C1 and C2. This means that the layout area occupied by the capacitor portions is increased, which is disadvantageous in increasing the degree of integration of the semiconductor integrated circuits.

Further, increase in capacitances of capacitors C1 and C2 so as to obtain sufficient stability of the output potential means that transitional response of the internal power supply circuit to fluctuations in power supply voltage and load is degraded.

SUMMARY OF THE INVENTION

An object of the present invention is to provide a semiconductor integrated circuit device having an internal power supply circuit which is capable of stabilizing output potential of the internal power supply circuit, that is, stabilizing output potential level with respect to fluctuations in power supply voltage and load, while suppressing increase in the layout area.

Another object of the present invention is to provide a semiconductor integrated circuit device having an internal power supply circuit which is capable of realizing both stabilization of the output potential level and increase in transitional response of the output potential level.

Briefly stated, the present invention provides a semiconductor integrated circuit device including a first power supply node, a second power supply node and an internal voltage supplying circuit. The first power supply node is supplied with a first power supply potential. The second power supply node is supplied with a second power supply potential. The internal voltage supplying circuit includes a voltage generating circuit for generating a prescribed internal voltage which is intermediate between the first and second power supply potentials, first and second capacitances each having one end connected to an output node of the voltage generating circuit, a first voltage control circuit for rendering conductive connection between the power supply node and the output node as potential at the other end of the first capacitance lowered, and a second voltage control circuit for rendering conductive connection between the second power supply node and the output node as the potential at the other end of the second capacitance rises.

Therefore, an advantage of the present invention is that a semiconductor integrated circuit device including an internal voltage supplying circuit which quickly returns to the steady potential level when the output voltage fluctuates, in other words, an internal voltage supplying circuit having superior transitional response, is implemented.

Another advantage of the present invention is that a semiconductor integrated circuit device including an internal power supply circuit capable of controlling increase in layout area while improving transitional response is implemented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
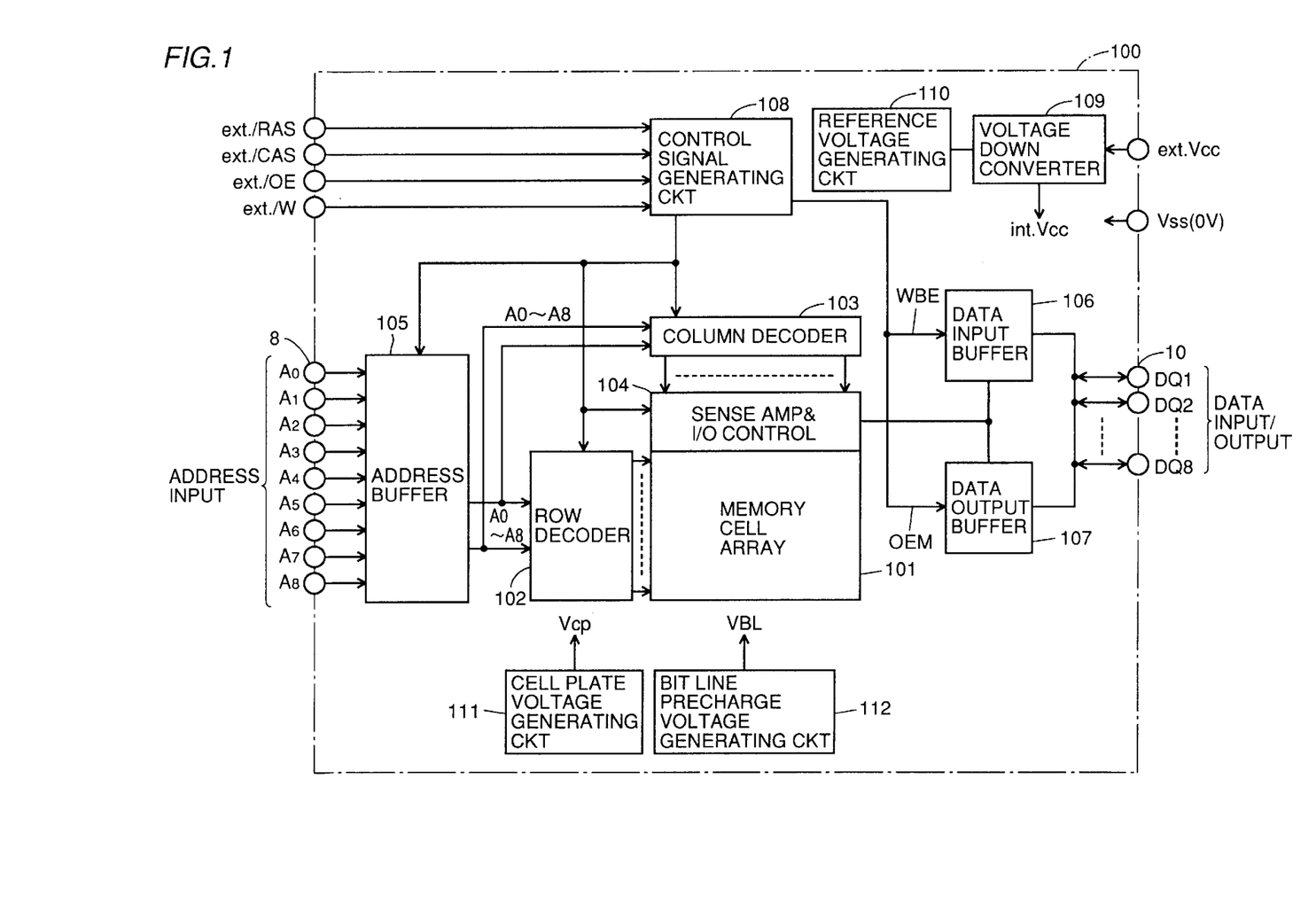
FIG. 1 is a schematic block diagram showing a structure of a semiconductor memory device 100 in accordance with a first embodiment of the present invention.

FIG. 1 is a schematic block diagram showing a structure of a semiconductor memory device 100 in accordance with a first embodiment of the present invention.

Referring to FIG. 1, semiconductor memory device 100 includes a control signal generating circuit 108 receiving external control signals ext./W, ext./OE, ext./RAS and ext./CAS applied to external control signal input terminal through terminals 2 to 5 and generating internal control signals; a memory cell array 101 having memory cells arranged in a matrix; an address buffer 105 receiving external address signals A0 to Ai applied through address signal input terminal 8 for generating internal row address signals and internal column address signals under the control of control signal generating circuit 108; and a row decoder 102 which is activated under the control of control signal generating circuit 108 for decoding an internal row address signal applied from address buffer 105 for selecting a row (word line) of memory cell array 101.

The signal ext./W applied to external control signal input terminal 2 is a write enable signal for designating data writing. The signal ext./OE applied to external control signal input terminal 3 is an output enable signal designating data output. The signal ext./RAS applied to external control signal input terminal 4 is a row address strobe signal for initiating internal operation of the semiconductor memory device and for determining active period of internal operation. When the signal ext./RAS is active, circuits related to the operation of selecting a row in the memory cell array 101 such as row decoder circuit 102 are rendered active. The signal ext./CAS applied to external control signal input terminal 5 is a column address strobe signal, which activates a circuit for selecting a column in memory cell array 101.

Semiconductor memory device 100 further includes a column decoder circuit 103 which is activated under the control of control signal generating circuit 108 for decoding an internal column address signal from address buffer circuit 105 and for generating a column selection signal for selecting a column of memory cell array 101; a sense amplifier for sensing and amplifying data of memory cells connected to the selected row of memory cell array 101; an I/O circuit for connecting the selected column of memory cell array 101 to an internal data bus in response to the column selection signal from column decoder circuit 103; a data output buffer 107 for generating external read data DQ0 to DQ8 from internal write data read to internal data bus at the time of data reading and for outputting the generated external read data to data input/output terminal 10 under the control of control signal generating circuit 18; and a data input buffer 106 for generating internal write data from external write data DQ1 to DQ8 applied to data input/output terminal 10 and for outputting the generated internal write data to corresponding internal data bus at the time of data writing under the control of control signal generating circuit 101. In FIG. 1, the sense amplifier and the I/O circuit are represented by one block 104. Output buffer circuit 107 is activated in accordance with activation of an internal output enable signal OEM generated by control signal generating circuit 108 in response to external output enable signal ext./OE in reading operation, and input buffer circuit 106 is activated in accordance with activation of an internal write enable signal WBE generated by control signal generating circuit 108 in response to the external write enable signal ext./W in write operation.

Semiconductor memory device 100 further includes a reference voltage generating circuit 110 receiving external power supply voltage ext.Vcc and ground potential Vss for generating a reference $V_{REF}$ which is the reference voltage with respect to the internal down converted voltage; a voltage down converter 109 receiving external power supply voltage ext.Vcc and reference voltage $V_{REF}$ for generating down converted internal voltage int.Vcc; a cell plate voltage generating circuit 111 receiving external power supply voltage ext.Vcc and ground voltage Vss for generating a cell plate voltage Vcp to be supplied to the cell plate of the memory cell; and a bit line precharge voltage generating circuit 112 for generating a voltage $V_{BL}$ for precharging the bit line pair at the time of standby.

As described above, both the cell plate voltage Vcp and bit line precharge voltage $V_{BL}$ are set to int.Vcc/2.

Figure 2:
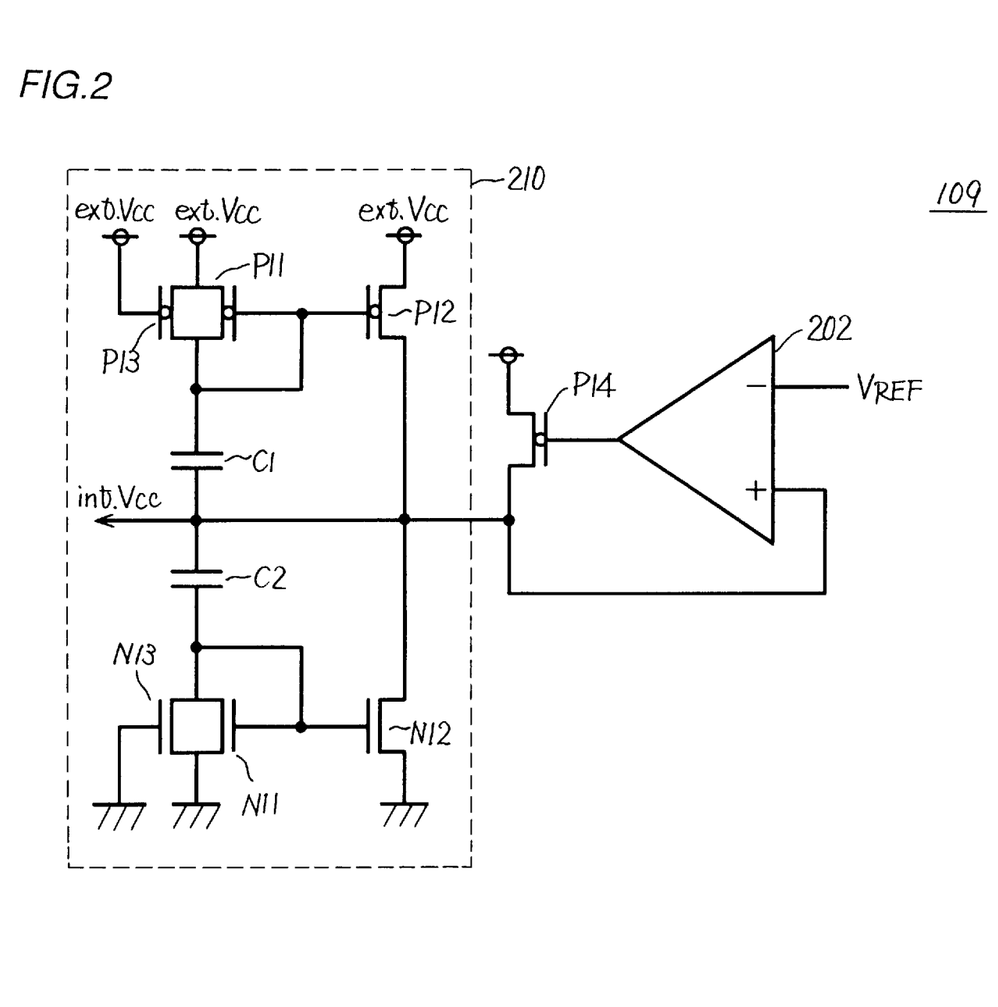
FIG. 2 is a schematic block diagram showing a structure of a voltage down convertor 109 in semiconductor memory device 100 in accordance with the first embodiment of the present invention.

FIG. 2 is a schematic block diagram showing the structure of voltage down converter 109 in the semiconductor memory device 100 in the first embodiment of the present invention.

Voltage down convertor 109 includes a differential amplifying circuit 202 receiving as one input, output potential $V_{REF}$ from reference voltage generating circuit 110; a P channel MOS transistor P14 connected between a node to which power supply potential ext.Vcc is supplied and the other input node of differential amplifying circuit 202 and receiving at its gate the output potential from differential amplifying circuit 202; and a voltage control circuit 210 receiving a potential at a node (hereinafter referred to as a first output node) between P channel MOS transistor P14 and the other input node of differential amplifying circuit 202 for outputting an internally down converted voltage int.Vcc.

Voltage control circuit 210 includes first and second capacitors C1 and C2 each having one end connected to the first output node; a P channel MOS transistor P11 having its source and drain connected to the power supply node to which the power supply potential ext.Vcc is supplied and to the other end of the first capacitor C1, respectively; and a P channel MOS transistor P12 having its source and drain connected to the power supply node to which the power supply potential Vcc is supplied and to the first output node, respectively. P channel MOS transistors P11 and P12 have their gates connected together, and P channel MOS transistor P11 has its gate connected to the drain.

A voltage control circuit 210 further includes an N channel MOS transistors N11 having its source and drain connected to the ground node to which the ground potential Vss is supplied and to the other end of the second capacitor C2, respectively; and an N channel MOS transistor N12 having its gate and drain connected to the ground node and the first output node, respectively. N channel MOS transistors N11 and N12 have their gates connected together, and N channel MOS transistor N11 has its gate and drain connected to each other.

More specifically, P channel MOS transistors P11 and P12 and N channel MOS transistors N11 and N12 are paired respectively, providing a current mirror circuit.

Figure 3:
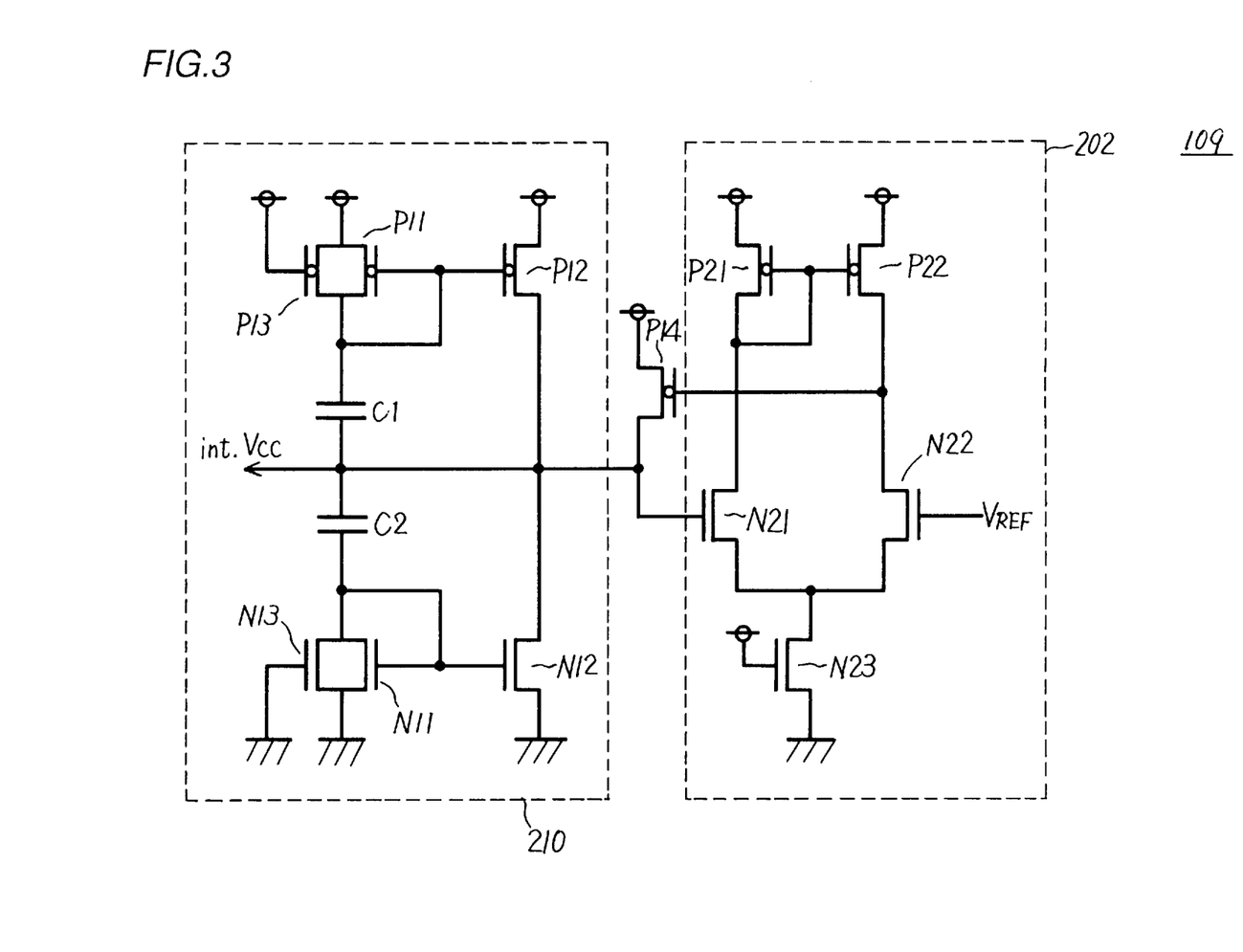
FIG. 3 shows the structure of voltage down convertor 109 in greater detail.

FIG. 3 shows the structure of voltage down convertor 109 of FIG. 2 in greater detail.

Referring to FIG. 3, a current mirror type differential amplifier is used as differential amplifying circuit 202, as in conventional internal voltage down convertor 500 shown in FIG. 7.

More specifically, differential amplifying circuit 202 includes a pair of P channel MOS transistors P21 and P22 having their sources both connected to the node to which the power supply potential ext.Vcc is supplied. P channel MOS transistor P21 has its gate and drain connected to each other, and MOS transistors P21 and P22 constitute a current mirror circuit.

Differential amplifying circuit 202 further includes an N channel MOS transistor N21 having its drain connected to the drain of P channel MOS transistor P21 and its gate connected to the drain of P channel MOS transistor P14; an N channel MOS transistor N22 having its drain connected to the drain of P channel MOS transistor P22 and receiving at its gate the reference potential $V_{REF}$; an N channel MOS transistor N23 connected between the sources of MOS transistors N21 and N22 and the node to which the ground potential Vss is supplied and receiving at its gate the power supply potential ext.Vcc.

More specifically, the gates of N channel MOS transistors N21 and N22 serve as the first and second input nodes of differential amplifying circuit 202, and the potential at the node between the drain of MOS transistors P22 and N22 serve as an output potential of the differential amplifying circuit 202.

In this embodiment also, it is possible to control the gate potential of N channel MOS transistor N23 by a differential amplifier activating signal, so that the differential amplifying circuit is operated only while the differential amplifying circuit activating signal is active (at the "H" level).

Since P channel MOS transistors P21 and P22 provide a current mirror circuit, the currents flowing to N channel MOS transistors N21 and N22 is constantly kept at equal values. Since the gate potential of N channel MOS transistor N22 is fixed at the reference potential $V_{REF}$, when the gate potential of N channel MOS transistor N21 rises to be higher than $V_{REF}$, for example, drain potential of MOS transistor N22 rises so that the same current as that flowing in MOS transistor N21 flows through MOS transistor N20. Accordingly, gate potential of P channel MOS transistor P14 increases, so that transistor P23 is weakly on. Accordingly, the potential at the first output node, that is the gate potential of N channel MOS transistor N21, lowers.

When the gate potential of N channel MOS transistor N21, that is, the potential level at the first output node becomes lower than the reference potential VEF, the potential level at eh first output node is pulled up by an operation reverse to the operation above.

The operation of voltage down converter 109 will be described.

Figure 4:
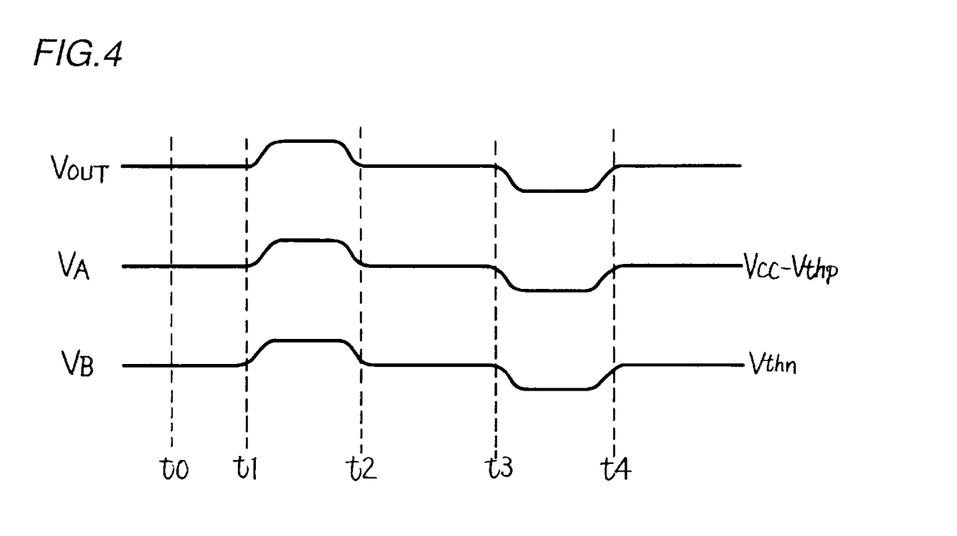
FIG. 4 is a first timing chart showing the operation of voltage down converter 109.

FIG. 4 is a timing chart showing the operation of the voltage down converter shown in FIG. 2.

In the following, the potential level at the first output node will be represented by $V_{OUT}$.

It is assumed that in order to ensure sufficient current drivability to return to the reference potential level $V_{REF}$ when the potential level at the first output node fluctuates, the gate width of transistor P12 is made larger than P channel MOS transistor P11.

Similarly, it is assumed that the gate width of transistor N12 is made larger than that of N channel MOS transistor N11.

In steady state at time t0, no current flows in the first current mirror circuit consisting of P channel MOS transistors P11 and P12 and in the second current mirror circuit consisting of N channel MOS transistors N11 and N12. More specifically, the potential at the node (hereinafter referred to as node A) between the drain of P channel MOS transistor P11 and capacitor C1 is Vcc−Vthp which is lower than the power supply potential Vcc by the threshold voltage Vthp of P channel MOS transistors P11 and P12.

Similarly, the potential at node (hereinafter referred to as node B) between N channel MOS transistor N11 and capacitor C2 is at Vthn which is higher than the ground potential Vss by the threshold voltage Vthn which is the threshold voltage of N channel MOS transistors N11 and N12.

At time t1, when the potential $V_{OUT}$ rises because of fluctuation in power supply voltage, for example, the potential levels at nodes A and B (represented by $V_A$ and $V_B$ in the figure) both rise by the function of potential coupling caused by capacitors C1 and C2.

As the potential level at node B increases, N channel MOS transistor N12 is rendered conductive, and lowers the potential level at the first output node, that is, the potential $V_{OUT}$. Therefore, at time t2, the potential $V_{OUT}$ lowers and is stabilized at the value it assumed at time t0.

Meanwhile, if the potential $V_{OUT}$ lowers at time t3, for example, potential levels at nodes A and B both lower and accordingly, P channel MOS transistor P12 is rendered conductive. Therefore, the potential level at the first output node, that is, potential $V_{OUT}$ increases, and attains the steady state at time t4 at a value is assumed at time t0.

In the foregoing, fluctuation of potential $V_{OUT}$ has been described as being in the range of the threshold voltage Vthp or Vthn.

However, the power supply potential $V_{OUT}$ may momentarily fluctuate with larger absolute value.

Figure 5:
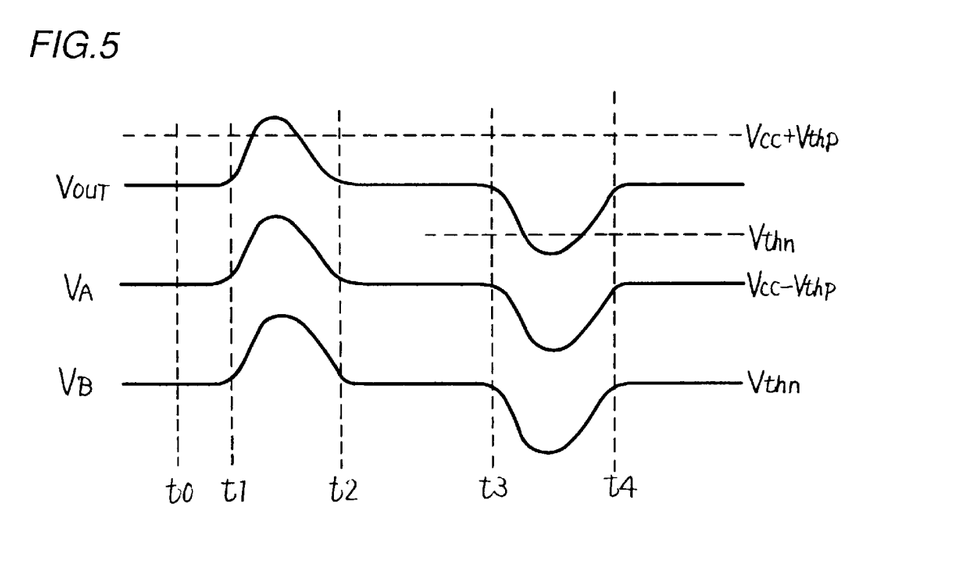
FIG. 5 is a second timing chart showing the operation of voltage down converter 109.

FIG. 5 is a timing chart showing the operation of voltage control circuit 210 in such an event.

In the steady state of time to, the potential level at node A is Vcc−Vthp, and the potential level at node B is Vthn, as in the case of FIG. 4.

Assume that the potential $V_{OUT}$ fluctuates greatly at time t1 to be higher than Vcc+Vthp. Then the potential levels at nodes A and B increase similarly. At this time, since the potential level at node A becomes higher than Vcc+Vthp, P channel MOS transistor P13 is rendered conductive. Accordingly, the potential level at node A lowers to the potential Vcc+Vthp by the discharge to power supply potential Vcc. Accordingly, both the potential $V_{OUT}$ and the potential at node B lower. Further, as in the case of FIG. 4, the potential level at the gate potential of N channel MOS transistor N12, that is, the potential level at node B increases, N channel MOS transistor N12 is rendered conductive, and potential $V_{OUT}$ lowers.

More specifically, if the potential $V_{OUT}$ fluctuates greatly, not only N channel MOS transistor N12 but also P channel MOS transistor P13 is rendered conductive, pulling back the potential $V_{OUT}$ to the value in the steady state.

Similarly, assume that the potential level lowers greatly at time t3 to be lower than −Vthn. In that case, N channel MOS transistor N13 is rendered conductive and the potential level at node B rises because of charges from the ground potential. In response, the potential levels of potential $V_{OUT}$ and of the node A rise. At the same time, P channel MOS transistor P12 is rendered conductive, and hence the level of the potential $V_{OUT}$ is pulled back to the value of the steady state.

More specifically, when the potential $V_{OUT}$ fluctuates greatly to the negative side, both P channel MOS transistor P12 and N channel MOS transistor N13 are rendered conductive, so that the potential $V_{OUT}$ is pulled back to the steady state.

Since there are transistors P13 and N13, even when there is a great voltage fluctuation,, the potential level can be quickly returned to the steady state, and hence transitional response of the voltage down convertor can be improved.

[Second Embodiment]

In the first embodiment, voltage control circuit 210 was used for internal voltage down converter 109.

Similarly, it is possible to apply voltage control circuit 210 to cell plate voltage generating circuit 111 and bit line precharge voltage generating circuit 112 in the structure of the semiconductor memory device 100 shown in FIG. 1.

Figure 6:
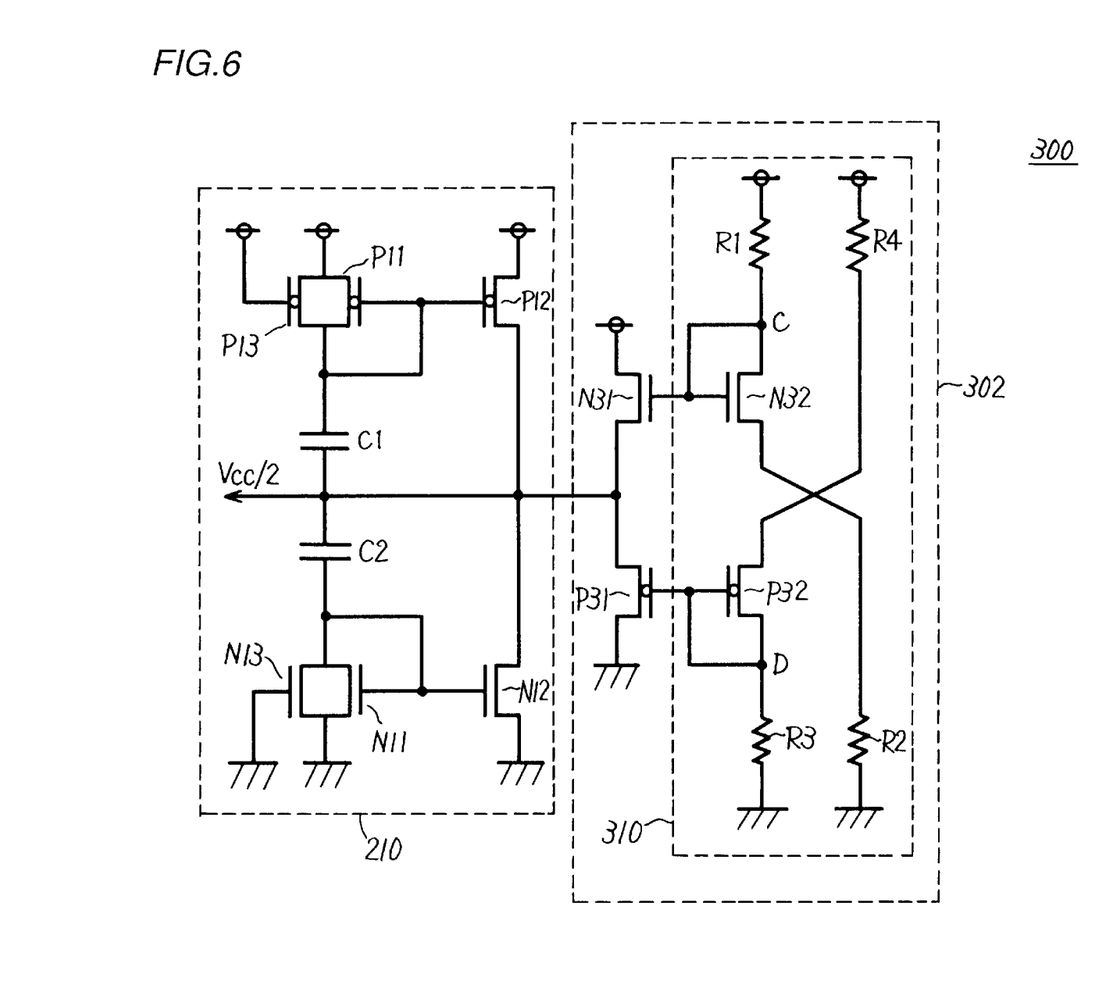
FIG. 6 is a schematic diagram showing the structure of an internal power supply circuit 300 in accordance with a second embodiment of the present invention.

FIG. 6 shows a structure when voltage control circuit 210 is applied to an internal power supply circuit 300 generating the voltage Vcc/2 such as cell plate voltage generating circuit 110 and bit line precharge voltage generating circuit 112.

Internal power supply circuit 300 includes a Vcc/2 generating circuit 302 and voltage control circuit 210.

The structure of voltage control circuit 210 is the same as voltage control circuit 210 shown in FIG. 3. In the following, the output node of Vcc/2 generating circuit 302 will be referred to as the second output node, and it is assumed that the voltage control circuit 210 receives the potential level at the second output node and outputs the potential Vcc/2.

The Vcc/2 generating circuit 302 includes an n channel MOS transistor N31 connected between the power supply node to which the power supply potential Vcc is supplied and the second output node; a P channel MOS transistor P31 connected between the ground node to which the ground potential is supplied and the second output node; and a bias control circuit 309 for controlling gate potentials of P channel MOS transistor P31 and N channel MOS transistor N31.

Bias control circuit 310 includes a resistor R1 having one end connected to the power supply node to which the power supply potential Vcc is supplied; an N channel MOS transistor N30 having its drain and gate connected to the other end of resistor R1; a resistor R2 connected between the source of MOS transistor N32 and the ground node; a resistor R3 having one end connected to the ground node; a P channel MOS transistor P32 having its drain and gate connected to the other end of resistor R3; and a resistor R4 connected between the source of P channel MOS transistor P32 and the power supply node to which the power supply potential Vcc is supplied. N channel MOS transistors N32 and N31 have their gates connected to each other, and P channel MOS transistors P32 and P31 have their gates connected to each other.

In the following, the node between resistor R1 and N channel MOS transistor N32 will be referred to as node C, and the node between resistor R3 and P channel MOS transistor P32 will be referred to as node D.

When the resistance values of resistors R1 and R2 are set to the same and sufficiently large value, the potential level at node C will be Vcc/2+Vthn, where Vthn is the threshold voltage of N channel MOS transistor N32. Similarly, when resistance values of resistors R3 and R4 are made the same sufficiently large value, the potential level at node D will be Vcc/2−Vthp, where Vthp is the threshold voltage of P channel MOS transistor P32. The structure is adapted such that the potential level at node C is applied to the gate of N channel MOS transistor N31, and the potential level at node B is applied to the gate of P channel MOS transistor P31. Further, N channel MOS transistors N31 and N32, or P channel MOS transistors P31 and P32 are adapted to have approximately the same transistor properties. Therefore, even when process conditions or the like fluctuate, the potential level at the node between N channel MOS transistor N31 and P channel MOS transistor P31 is stably maintained at the potential level of Vcc/2.

Receiving the output potential from Vcc/2 generating circuit 302, the voltage control circuit 210 is pulled back to the potential level in the steady state even the output potential $V_{out}$ increases, as N channel MOS transistor N12 is rendered conductive as in the first embodiment.

Meanwhile, if the potential $V_{OUT}$ lowers, P channel MOS transistor P12 is rendered conductive, and hence it is pulled back to the potential level in the steady state.

Further, as in the first embodiment, if the output potential $V_{OUT}$ increases greatly, both P channel MOS transistor P13 and N channel MOS transistor N12 are rendered conductive, and if the potential $V_{OUT}$ lowers greatly, both P channel MOS transistor P12 and N channel MOS transistor N13 are rendered conductive so that the potential $V_{OUT}$ is pulled back to the value it assumes in the steady state.

Therefore, in the internal power supply circuit 300 in the second embodiment also, for example, in the cell plate voltage generating circuit and the bit line precharge voltage generating circuit, the output potential will be stabilized and transitional response can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:
   a first power supply node to which a first power supply potential is supplied;
   a second power supply node to which a second power supply potential lower than said first power supply potential is supplied; and
   an internal voltage supplying means for supplying an internal voltage;
   said internal voltage supplying means including
      voltage generating means for generating said internal voltage at a prescribed level between said first and second power supply potentials,
      first and second capacitance means each having one end connected to an output node of said voltage generating means,
      first voltage control means responsive to lowering of an output potential of said output node for increasing said output potential level to said prescribed level,
      said first voltage control means including
         first switching means in response only to lowering of a potential level at the other end of said first capacitance means for connecting said first power supply node to said output node; and
         first switch controlling means for maintaining said first switching means non-conductive at least while said output potential is higher than said prescribed level; and
      second voltage control means responsive to increase of an output potential level of said output node for decreasing said output potential level to said prescribed level,
      said second voltage control means including
         second switching means in response only to increase of a potential level at the other end of said second capacitance means for connecting said second power supply node to said output node; and
         second switch controlling means for maintaining said second switching means non-conductive at least while said output potential is lower than said prescribed level.

2. A semiconductor integrated circuit device, comprising:
   a first power supply node to which a first power supply potential is supplied;
   a second power supply node to which a second power supply potential is supplied; and
   an internal voltage supplying means, including
      voltage generating means for generating an internal voltage at a prescribed level between said first and second power supply potentials,
      first and second capacitance means each having one end connected to an output node of said voltage generating means,
      first voltage control means responsive to lowering of a potential at the other end of said first capacitance means for rendering a conductive connection between said first power supply node and said output node, and
      second voltage control means responsive to increase in potential at the other end of said second capacitance means for rendering a conductive connection between said second power supply node and said output node, wherein
      said first voltage control means includes
         a first MOS transistor of a first conductivity type having source and drain connected to said first power supply node and to said output node, respectively, and
         a second MOS transistor of the first conductivity having source and drain connected to said first power supply node and to the other end of said first capacitance means, respectively, said first and second MOS transistors having their gates connected to each other and said second MOS transistor having its gate and drain connected to each other, and
      said second voltage control means includes
         a third MOS transistor of a second conductivity type having source and drain connected to said second power supply node and to said output node, respectively, and
         a fourth MOS transistor of the second conductivity type having source and drain connected to said second power supply node and to the other end of said second capacitance means, respectively, said third and fourth MOS transistors having their gates connected to each other and said fourth MOS transistor having gate and drain connected to each other.

3. The semiconductor integrated circuit device according to claim 2, wherein said first voltage control means includes a fifth MOS transistor of the first conductivity type connected parallel to said second MOS transistor and having its gate connected to said first power supply node; and said second voltage control means includes a sixth MOS transistor of the second conductivity type connected parallel to said fourth MOS transistor and having its gate connected to said second power supply node.

4. The semiconductor integrated circuit device according to claim 3, wherein said voltage generating means includes differential amplifying means for generating an output potential in accordance with a difference between input potentials applied to first and second input nodes, and a seventh MOS transistor of the first conductivity type having its source connected to said first power supply node and receiving at its gate the output potential from said differential amplifying means, said first input node receiving a prescribed reference potential, and the drain of said seventh MOS transistor and said second input node are connected to the output node of said voltage generating means.

5. The semiconductor integrated circuit device according to claim 3, wherein said voltage generating means includes an eighth MOS transistor of the second conductivity type connected between said first power supply node and said output node, a ninth MOS transistor of the first conductivity type connected between said second power supply node and said output node, and bias means controlling gate potential of said eighth and ninth MOS transistors;

said bias means includes a first resistor having one end connected to said first power supply node, a tenth MOS transistor of the second conductivity type having its drain and gate connected to the other end of said first resistor, a second resistor connected between the source of said tenth MOS transistor and said second power supply node, a third resistor having one end connected to said second power supply node, an eleventh MOS transistor of the first conductivity type having its drain and gate connected to the other end of said third resistor, and a fourth resistor connected between the source of said eleventh MOS transistor and said first power supply node; and said eighth and ninth MOS transistors have their gates connected to the gates of said tenth and eleventh MOS transistors.

6. The semiconductor integrated circuit device according to claim 1, said first switching means including a first MOS transistor of a first conductivity type having source and drain connected to said first power supply node and to said output node, respectively, said first switch controlling means including a second MOS transistor of the first conductivity having source and drain connected to said first power supply node and to the other end of said first capacitance means, said first and second MOS transistors having their gates connected to each other and said second MOS transistor having its gate and drain connected to each other, said second switching means including a third MOS transistor of a second conductivity type having source and drain connected to said second power supply node and to said output node, respectively, said second switch controlling means including a fourth MOS transistor of the second conductivity having source and drain connected to said second power supply node and to the other end of said second capacitance means, and said third and fourth MOS transistors having their gates connected to each other and said fourth MOS transistor having its gate and drain connected to each other.

* * * * *